(12) United States Patent
Polizzotto et al.

(10) Patent No.: US 8,274,783 B2
(45) Date of Patent: Sep. 25, 2012

(54) AVIONICS INSTRUMENT AND MOUNTING BRACKET

(76) Inventors: Joseph Polizzotto, Huntington Beach, CA (US); Marc Polizzotto, Huntington Beach, CA (US); Lawrence E. Elbert, Laguna Beach, CA (US)

( * ) Notice: Subject to any disclaimer, the term of this patent is extended or adjusted under 35 U.S.C. 154(b) by 243 days.

(21) Appl. No.: 12/657,196

(22) Filed: Jan. 15, 2010

(65) Prior Publication Data

US 2011/0176267 A1 Jul. 21, 2011

(51) Int. Cl.
*G06F 1/16* (2006.01)

(52) U.S. Cl. ......... 361/679.01; 361/679.02; 361/679.58; 248/27.1; 248/230.1; 340/971

(58) Field of Classification Search .................. 340/971; 361/679.58
See application file for complete search history.

(56) References Cited

U.S. PATENT DOCUMENTS

| | | | |
|---|---|---|---|
| 1,682,738 A * | 9/1928 | Buchanan | 285/195 |
| 3,934,177 A | 1/1976 | Horbach | |
| 4,430,691 A | 2/1984 | Rea | |
| 4,583,094 A | 4/1986 | Mosier | |
| 4,887,189 A | 12/1989 | Garrett | |
| 4,913,383 A * | 4/1990 | Hill et al. | 248/27.1 |
| 5,736,922 A | 4/1998 | Goode, III | |
| 5,896,098 A | 4/1999 | Goode, III | |
| 6,842,122 B1 | 1/2005 | Langner | |
| 6,867,711 B1 | 3/2005 | Langner | |
| 6,927,983 B1 | 8/2005 | Beseth | |
| 7,008,233 B1 | 3/2006 | Ruff | |
| 7,188,400 B1 | 3/2007 | Beseth | |
| 7,268,702 B2 | 9/2007 | Chamas | |
| 7,362,240 B2 | 4/2008 | Buell | |
| 7,415,330 B2 | 8/2008 | Saint Aroman | |
| 7,420,476 B2 | 9/2008 | Stiffler | |
| 7,437,221 B2 | 10/2008 | Hardman | |
| 7,446,675 B2 | 11/2008 | Dutton | |
| 7,473,931 B1 | 1/2009 | Beseth | |
| 7,538,662 B2 | 5/2009 | Allmendinger | |
| 2006/0060732 A1 | 3/2006 | Tannas | |
| 2006/0278783 A1 * | 12/2006 | Rubin | 248/230.1 |
| 2006/0293804 A1 | 12/2006 | Bethel | |
| 2008/0094255 A1 * | 4/2008 | Bethel | 340/971 |
| 2009/0103268 A1 | 4/2009 | Bryan | |

* cited by examiner

*Primary Examiner* — Anthony Q Edwards
(74) *Attorney, Agent, or Firm* — Gray Law Firm; Gordon E. Gray, III

(57) ABSTRACT

The present invention is an avionics instrument and mounting bracket. In particular, the present invention is directed to an avionics instrument that can be mounted in a variety of positions on an aircraft instrument panel. The mounting bracket preferably comprises a cylindrical interior and an exterior with squared sides and rounded corners. The bracket has an adjustment gap with first and second ports on opposing sides and an adjustment screw spanning the adjustment gap to adjust the tightness of the bracket. The front of the bracket preferably has four panel screw ports. The avionics instrument has a display panel mounted to a cylindrical electronics housing where the diameter of the housing is less than the length of the display panel. The display panel preferably has four positional modes of display and a control button for switching between the display modes. The cylindrical electronics housing is inserted into the bracket.

9 Claims, 7 Drawing Sheets

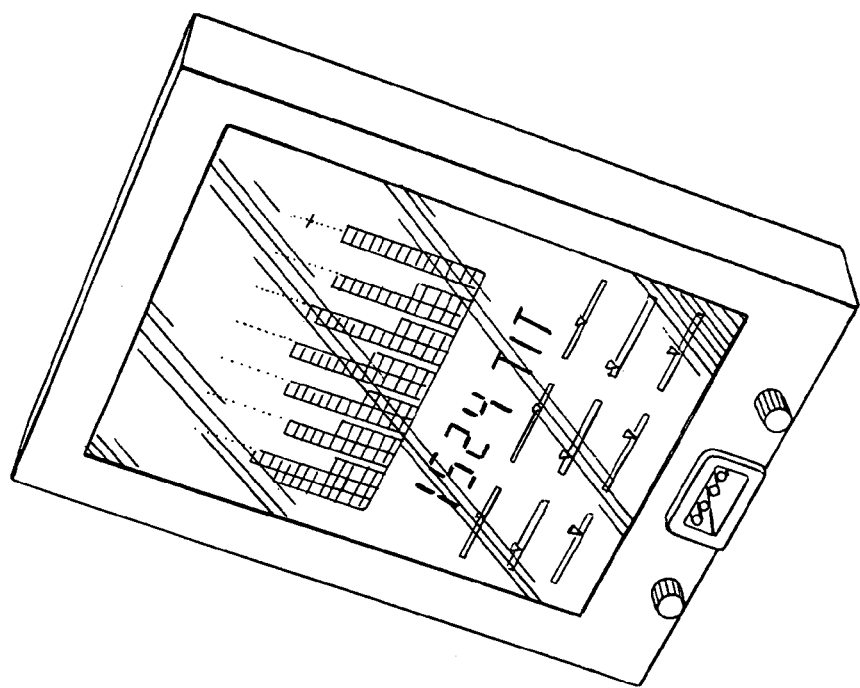
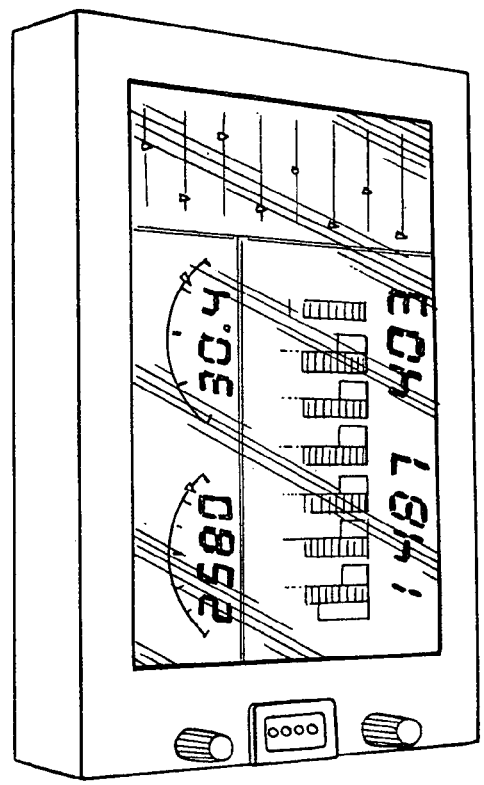
FIG. 2a
FIG. 2b

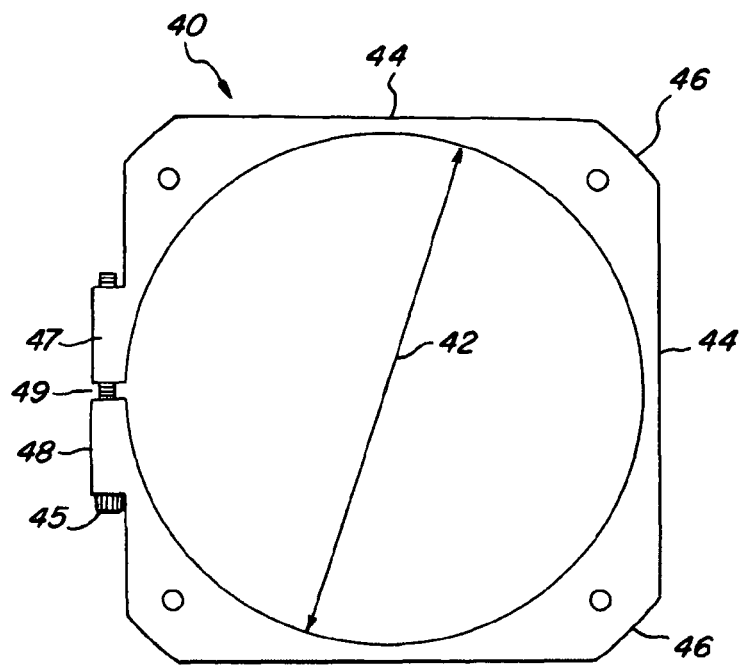
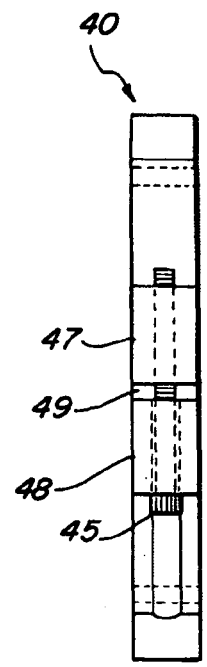
FIG. 5  FIG. 6
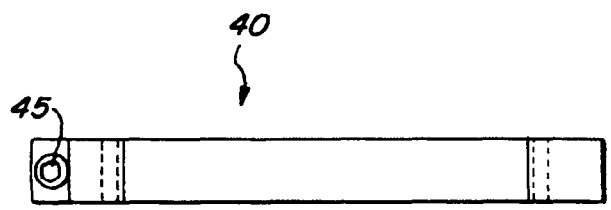
FIG. 7

AVIONICS INSTRUMENT AND MOUNTING BRACKET

TECHNICAL FIELD

The present invention is an avionics instrument and mounting bracket. In particular, the present invention is directed to an avionics instrument display that can be mounted in a variety of positions on an instrument panel.

BACKGROUND ART

Standard instrument panels in aircraft often comprise pre-cut holes of typical sizes, roughly 2 inches and 3 inches in diameter. Accordingly, after-market avionics instruments are often made to fit these pre-cut holes but are limited in how they can be positioned on the panel. Moreover, given the substantial heat generated by electronics in current avionics, these instruments can become, inter alia, hot to the touch unless properly cooled with a fan or otherwise ventilated. The present invention provides an improved avionics instrument display that can be mounted to an aircraft panel in a variety of positions and kept cooler without the use of a fan.

SUMMARY OF THE INVENTION

The present invention is an avionics instrument and mounting bracket. In particular, the present invention is directed to an avionics instrument that can be mounted in a variety of positions on an aircraft instrument panel. The mounting bracket preferably comprises a cylindrical interior and an exterior with squared sides and rounded corners. The bracket has an adjustment gap with first and second ports on opposing sides and an adjustment screw spanning the adjustment gap to adjust the tightness of the bracket. The front of the bracket preferably has four panel screw ports. The avionics instrument has a display panel mounted to a cylindrical electronics housing where the diameter of the housing is less than the length of the display panel. The display panel preferably has four positional modes of display and a control button for switching between the display modes. The cylindrical electronics housing is inserted into the bracket.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 2*a* is a front view of a preferred embodiment of the instrument in a first portrait display position showing first portrait display mode in the display area;

FIG. 2*b* is a front view of a preferred embodiment of the instrument in a first landscape display position showing first landscape display mode in the display area;

FIG. 5 is a front view of a preferred embodiment of the mounting bracket portion of the invention;

FIG. 6 is a side view of a preferred embodiment of the mounting bracket portion of the invention;

FIG. 7 is a side view of a preferred embodiment of the mounting bracket portion of the invention;

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide an improved avionics instrument and mounting bracket.

Figure 1:
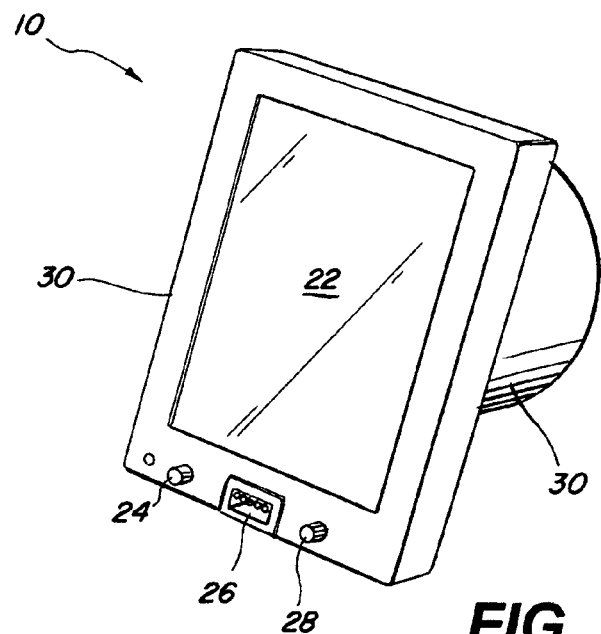
FIG. 1 is a front perspective view of a preferred embodiment of the avionics instrument portion of the invention.

Referring now to FIG. 1, a preferred embodiment of the avionics instrument 10 is shown. The avionics instrument 10 shown has a display panel 20 mounted to a cylindrical electronics housing 30. The display panel 20 shown has a display area 22, a first control button 24 (preferably the "STEP" button), a USB data port 26, and a second control button 28 (preferably the "LF" button). The electronics for the avionics instrument 10 not related to the display panel 20 are preferably contained within the cylindrical electronics housing 30. Data/Information from probes connected to the instrument (not shown) is collected and/or analyzed within the cylindrical electronics housing 30. The data and analysis are then displayed in the display area 22 of the display panel 20. FIG. 1 shows the instrument 10 in position to show a portrait display mode.

Figure 8:
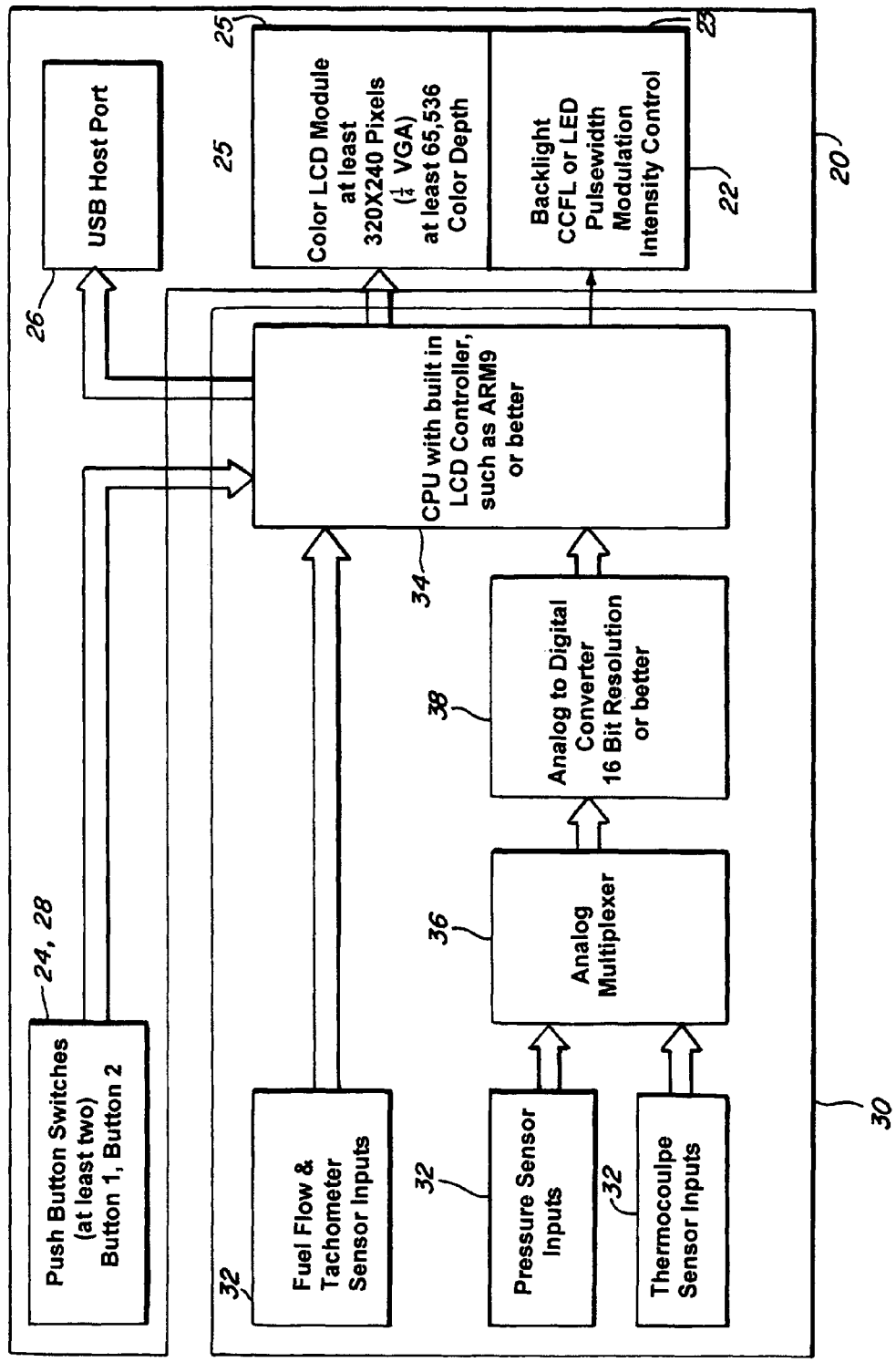
FIG. 8 is a diagram of a preferred embodiment of the avionics instrument; and, FIG. 9 is a flow chart showing a preferred method for adjusting the display alignment of the instrument.

Referring now to FIG. 8, a diagram of a preferred embodiment of the instrument 10 is shown. As stated above, the electronics for the instrument are mostly contained within the cylindrical electronics housing 30. Fuel flow and tachometer sensor inputs 32 are preferably connected directly to a central processing unit (CPU) 34. The CPU 34 preferably has a built-in LCD controller such as an ARM9 or other processor. Pressure sensor and thermocouple sensor inputs 32 are preferably connected to the CPU 34 via an analog multiplexer 36 and analog to digital converter 38. The analog to digital converter 38 preferably has a 16-bit resolution or better.

As shown in FIG. 8, the cylindrical electronics housing 30 is attached to the display panel 20. The display panel 20 preferably comprises a display panel 20 housing a backlight CCFL or LED with pulsewidth modulation intensity control 23 and a color LCD module 25. The backlight CCFL or LED 23 and color LCD module 25, are connected to, and controlled by, the CPU 34. The color LCD module 25 preferably has a resolution of at least 320×240 pixels (¼ VGA) and preferably at least 65,536 color depth. As shown in FIG. 8, the push button switches 24, 28 are preferably connected to the CPU 34, as is the USB host port 26.

Referring back to FIG. 1, the cylindrical electronics housing 30 preferably has a primary dimension, e.g. a diameter, that is less than 3.0" inches so that the housing 30 can fit into (and rotate within) most openings on common aircraft panels. Conversely, the display panel 20 preferably has a primary dimension, e.g. a length, which is greater than 3.0" inches so the display panel 20 cannot pass through common aircraft panel openings. Also, the display panel 20 is preferably mounted off-center from the cylindrical electronics housing 30.

Figure 2:
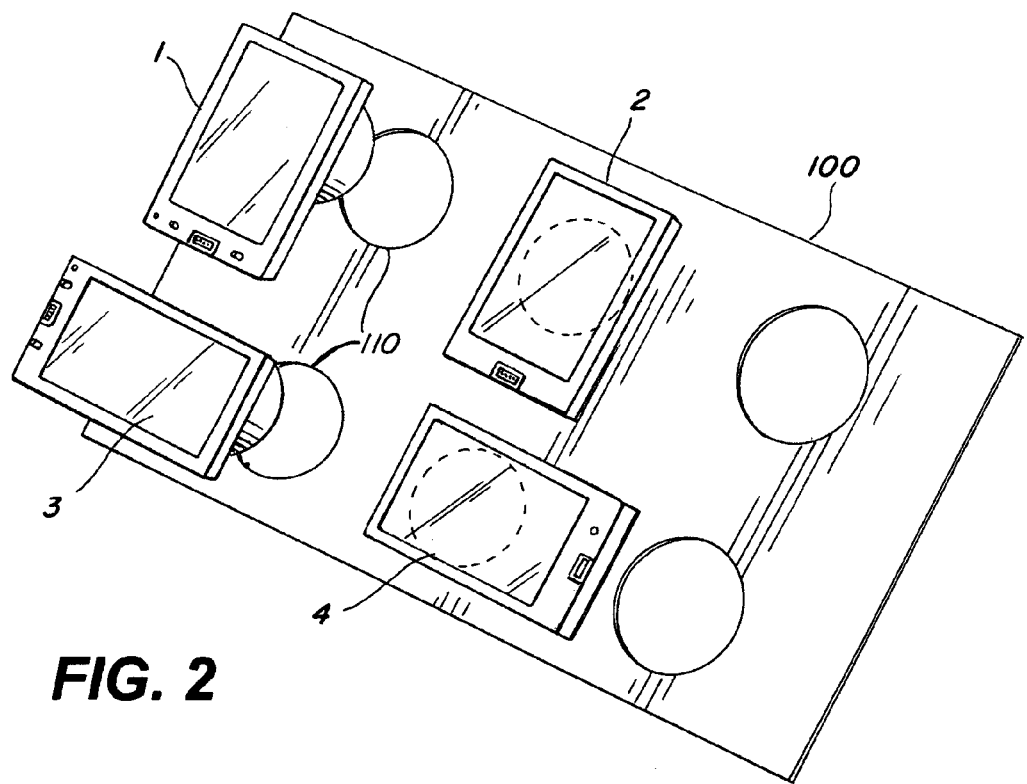
FIG. 2 is a front perspective exploded view of four preferred embodiments of the avionics instruments installed in an aircraft instrument panel in four different positional display modes, namely two landscape and two portrait display modes.

Moving on to FIG. 2, a preferred embodiment of the avionics instrument 10 is shown in four different installation positions in a standard aircraft panel 100. Instrument 1 is shown in first portrait display position. The length of the display panel 20 is vertical and a significant portion of the display panel 20 extends below the aircraft panel opening 110. Instrument 3 is shown in first landscape display position. The length of the display panel 20 is horizontal and a significant portion of the display panel 20 extends to the left of the aircraft panel opening 110 to which the instrument 3 is mounted. Instrument 2 is shown in second portrait display position. The length of the display panel 20 is vertical and a significant portion of the display panel 20 extends above the aircraft panel opening 110. Instrument 4 is shown in second landscape display position. The length of the display panel 20 is horizontal and a significant portion of the display panel 20 extends to the right of the aircraft panel opening 110 to which the instrument 4 is mounted. Accordingly, there are preferably four different display positions for this embodiment of avionics instrument 10.

Figure 2D:
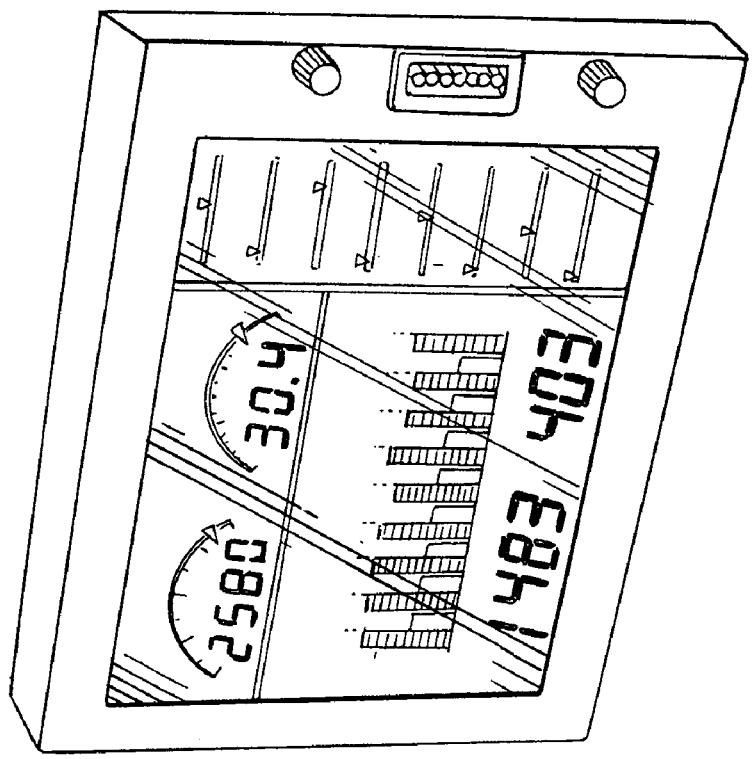
FIG. 2*d* is a front view of a preferred embodiment of the instrument in a second landscape display position showing second landscape display mode in the display area.
Figure 2C:
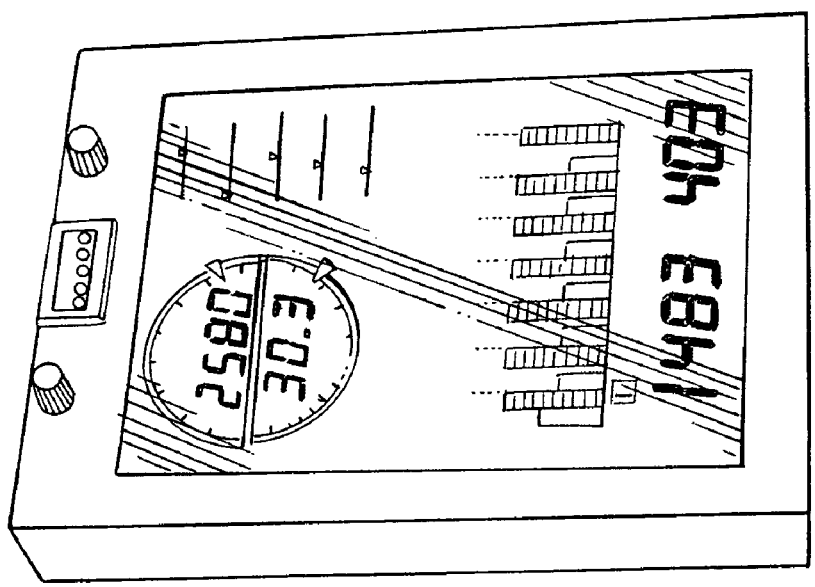
FIG. 2*c* is a front view of a preferred embodiment of the instrument in a second portrait display position showing second portrait display mode in the display area.

Moving now to FIGS. 2a through 2d, four preferred positional modes of display for the display panel 20 are shown. FIG. 2a shows a preferred embodiment of the display 20 in first portrait display mode. The display area 22 shows data, information and analysis from the avionics instrument in a portrait mode and the length of the display 20 extends below the diameter of the cylindrical electronics housing 30. FIG. 2b shows a preferred embodiment of the display 20 in first landscape display mode. The display area 22 shows data, information and analysis from the avionics instrument 10 in a landscape mode and the length of the display 20 extends to the left of the diameter of the cylindrical electronics housing 30. FIG. 2c shows a preferred embodiment of the display 20 in second portrait display mode. The display area 22 shows data, information and analysis from the avionics instrument 10 in a portrait mode and the length of the display 20 extends above the diameter of the cylindrical electronics housing 30. FIG. 2d shows a preferred embodiment of the display 20 in second landscape portrait display mode. The display area 22 shows data, information and analysis from the avionics instrument 10 in a landscape mode and the length of the display 20 extends to the right of the diameter of the cylindrical electronics housing 30.

Preferred readouts in the display area 22 of the instrument 10 include, but are not limited to, RPM, a map, 4-9 EGT, 4-9 CHT, TIT (two), oil temperature, oil pressure, OAT, volts, carburetor temperature, CDT, IAT, percentage of horse power, EGT SPAN, gallons of fuel consumed per hour, USD, REM, REQ, miles per gallon, and USB data. These readouts can be displayed in a number of different manners and formatted in a variety of different screen positions for each positional mode of display. Thus, each positional mode of display can have a variety of alternate screens displayed.

Figure 3:
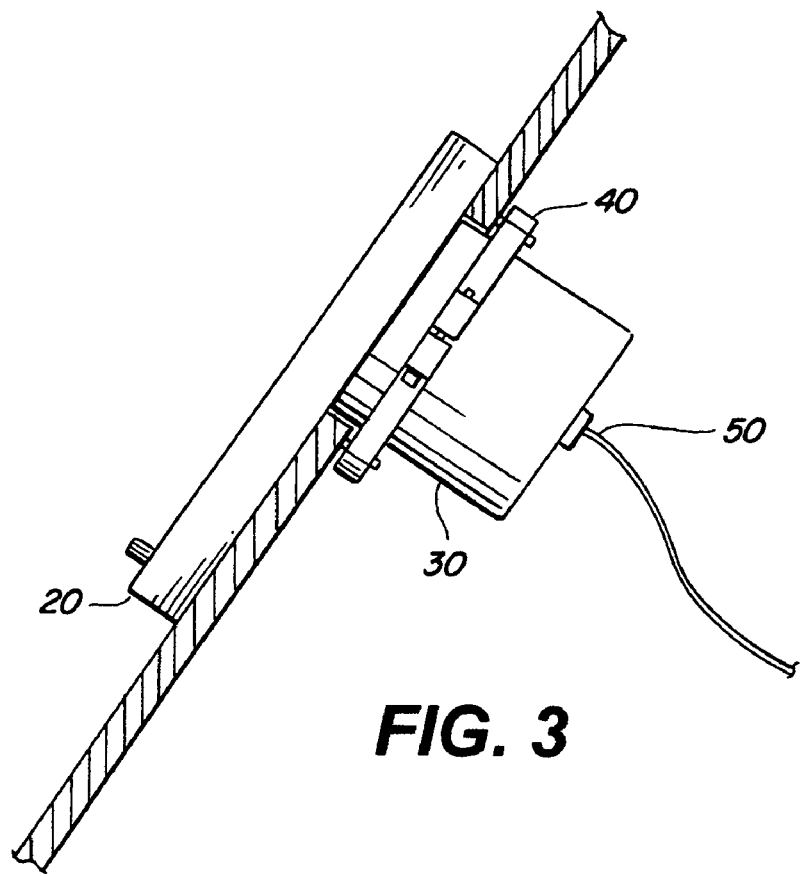
FIG. 3 is a side view of a preferred embodiment of the invention installed in a portrait display mode and held in place by a preferred embodiment of the mounting bracket.

Moving on to FIG. 3, a side view of a preferred embodiment of the invention is shown installed in an aircraft panel 100. The cylindrical electronics housing 30 is inserted into the panel 100 at an opening 110. The user then selects the installation position for the display panel 20 by rotating the instrument 10 in the opening 110. In FIG. 3, the first portrait mode has been selected. The instrument is then held in its installation position by a mounting bracket 40 (described below.) The user then connects one or more probes 50 (partially shown) from the aircraft engine to the cylindrical electronics housing 30.

The instrument 10 is preferably "plug and play" with respect to the probes 50 connected to the cylindrical electronics housing 30. Preferably, when instrument 10 is powered "on," the CPU 34 will test all inputs 32 for the presence of individual sensors or probes 50 and determine the type and number of sensors that will be monitored. For example, a thermocouple sensor input will be tested whether its electrical resistance is less than a pre-determined value. For oil pressure and fuel pressure, the sensor input will be tested whether their resistance is less than a pre-determined value. For fuel flow and tachometer, the readings from the particular input 32 are tested by the CPU 34 for whether the readings are greater than a pre-determined value. After the CPU software completes the "power on" tests, a configuration of the type and number of sensors connected to the instrument 10 are stored in memory and then output is displayed based on this configuration. In subsequent "power on" cycles, any new sensors/probes 50 discovered by the CPU 34 will be added to the stored configuration. If, however, a previously configured sensor/probe 50 is not detected, the CPU will display an error message pertaining to the now missing probe 50.

Once the probes 50 are connected and detected, the user then can select the proper positional mode of display for the display area 22. Using the control buttons (24, 28), the user selects the preferred positional mode of display for the instrument with the method shown in FIG. 9. In FIG. 3, the first portrait display mode would be selected (as shown in FIG. 2a.)

Figure 9:
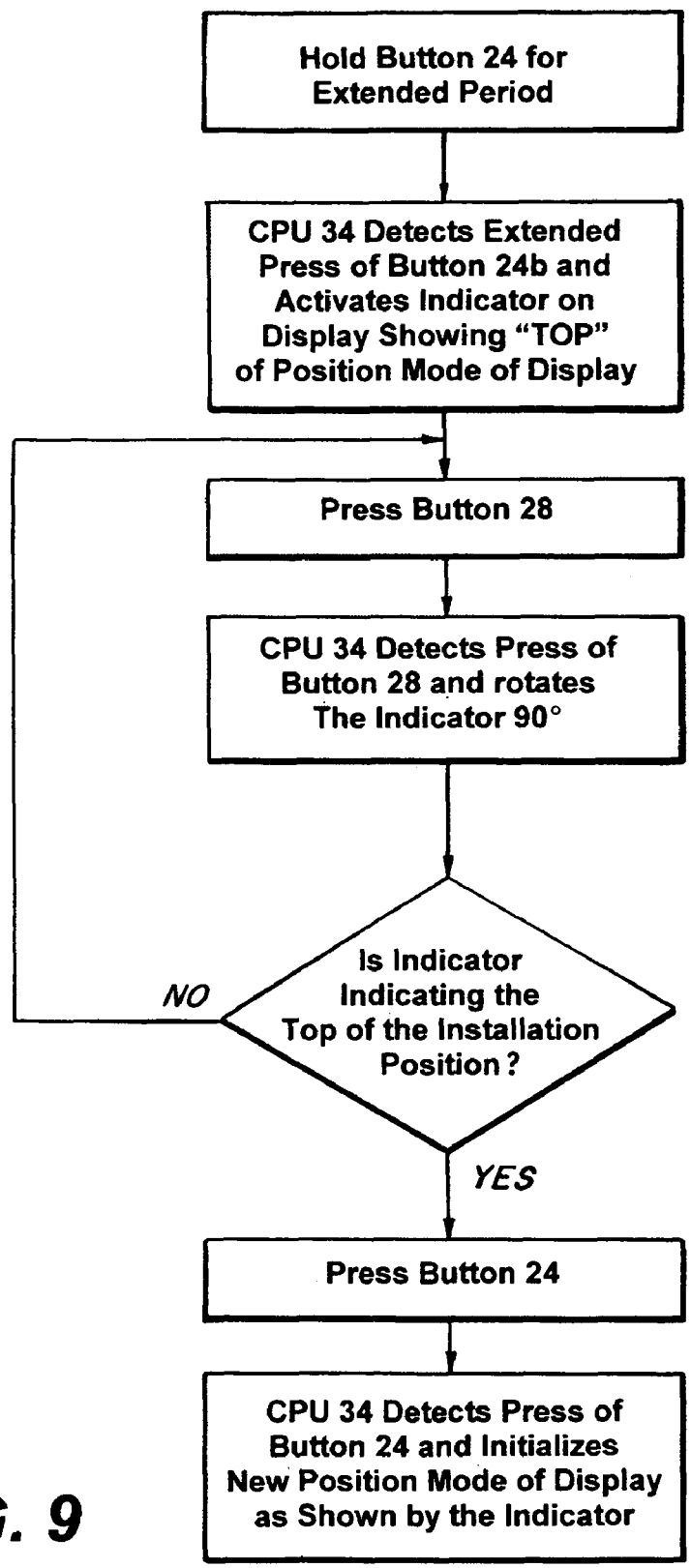

Referring to FIG. 9, a flow chart of a preferred method of switching between positional modes of display is shown. To begin the preferred switching method, the user presses and holds the "STEP" button 24 for an extended period of time, e.g. 8 seconds. Next, the CPU 34 detects the extended press of the button 24 and displays an indicator, e.g. an arrow, on the display 22 indicating the "top" of the current positional mode of display. Once the indicator is visible to the user, the user depresses the "LF" button 28. Next, the CPU 34 detects the press of the second button 28 and rotates the displayed indicator 90 degrees. If the user sees that the "top" of the indicator does not correspond to the top of the display position, the user presses the "LF" button 28 again and the CPU 34 rotates the indicator another 90 degrees. If the user sees that the indicator is indicating the top of the display position, the user presses the "STEP" button 24. The CPU 34 detects the press of button 24, removes the indicator from the display 22, and displays the new positional mode of display thus completing the process.

Figure 4:
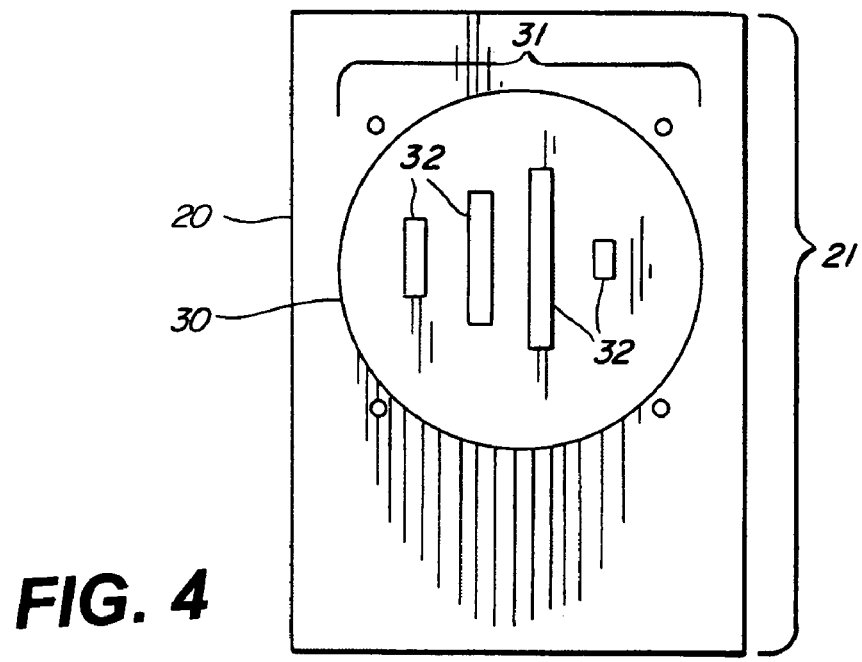
FIG. 4 is a rear view of a preferred embodiment of the avionics instrument portion of the invention.

FIG. 4 shows a rear view of a preferred embodiment of the avionics instrument 10 in first portrait display position. The length of the display panel 21 extends below the diameter of the cylindrical electronics housing 31. The cylindrical electronics housing 30 also preferably has multiple inputs 32 for probes 50. In FIG. 4, four different inputs 32 are shown. The display panel 22 also preferably has four holes 23 for screws used to hold the bracket 40. This allows a more flush fit of the display panel 20 to the aircraft panel 100.

FIG. 5 shows a front view of a preferred embodiment of the mounting bracket 40. First, the bracket 40 preferably has a cylindrical interior 42 with a diameter of approximately 3.01 inches. This allows the cylindrical electronics housing 30 to be inserted into (and rotated within) the cylindrical interior 42 of the bracket 40. Preferably, the bracket 40 has an exterior with squared sides 44 and rounded corners 46 and a preferred width of 3.1 inches. The exterior also preferably has adjustment ports 47 and 48 on opposite sides of an adjustment gap 49. An adjustment screw 45 traverses the ports 47 and 48 and spans the adjustment gap 49. Once the bracket 40 and instrument 10 are installed in a panel 100, the bracket 40 can hold the instrument 10 in place (in the desired display position) by tightening the adjustment screw 45 to reduce the adjustment gap 49.

FIGS. 6 and 7 show side views of the preferred embodiment of the mounting bracket 40. The bracket is preferably 0.375 inches thick and made from 2024 aluminum. Alternately, silver, gold, brass, copper and other aluminums can be used. The use of metals with high heat conductivity is preferred. By using such metal, a surprising result was achieved. The heat from the instrument 10 is conducted away from the display panel 20 of the instrument 10 and into the ambient air and/or dispersed throughout the aircraft panel 100. Thus, the user and the instrument 10 receive protection from an excessively heated display panel 20. For example, the surface temperature of the display panel 20 has been reduced by approximately 30 degrees (° F.) by using the preferred mounting bracket 40. Moreover, by using the disclosed mounting bracket 40, the user does not need to install a fan to cool the instrument 10 and thereby take up additional space on the panel 100 or require additional power to operate the fan.

Thus, an improved avionics instrument display and mounting bracket is described above that is more easily positioned in a standard aircraft panel and cooled without a fan. In each of the above embodiments, the different positions and structures of the present invention are described separately in each of the embodiments. However, it is the full intention of the inventors of the present invention that the separate aspects of each embodiment described herein may be combined with the other embodiments described herein. Those skilled in the art will appreciate that adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An avionics instrument metal mounting bracket comprising:
    a cylindrical interior;
    an exterior where one side of the exterior has first and second adjustment ports on opposing sides of an adjustment gap in the one side;
    an adjustment screw inserted into the first and second ports and spanning the adjustment gap; and,
    a front face having at least one panel screw port.

2. The avionics instrument metal mounting bracket of claim 1 where the metal mounting bracket comprising aluminum.

3. The avionics instrument metal mounting bracket of claim 1 where the metal for the mounting bracket is selected from the group consisting of gold, silver, copper, aluminum and brass.

4. The avionics instrument metal mounting bracket of claim 1 where the exterior has squared sides and radiused corners and the front face has four panel screws ports.

5. An avionics instrument and mounting bracket comprising:
    a mounting bracket having a cylindrical interior, an exterior where one side of the exterior has first and second ports on opposing sides of an adjustment gap in the one side, an adjustment screw inserted into the first and second ports and spanning the adjustment gap; and, a front face having at least one panel screw port;
    an avionics instrument, having a cylindrical electronics housing with a primary dimension, attached to a display panel with a primary dimension where the primary dimension of the display panel exceeds the primary dimension of the cylindrical electronics housing;
    where the display panel has at least two positional modes of display and a control button for switching between the at least two positional modes of display;
    where the cylindrical electronics housing is pivotally inserted into the cylindrical interior of the mounting bracket and held by tightening the adjustment screw.

6. The avionics instrument and mounting bracket of claim 5 where the display panel has four positional modes of display.

7. The avionics instrument and mounting bracket of claim 5 where the cylindrical electronics housing has a center and the display panel has a center offset from the center of the cylindrical electronics housing.

8. The avionics instrument and mounting bracket of claim 5 where the mounting bracket is made from a metal selected from the group consisting of gold, silver, copper, aluminum and brass.

9. The avionics instrument and mounting bracket of claim 5 where the display panel has a landscape positional mode of display and a portrait positional mode of display.

* * * * *